(12) United States Patent
Kim et al.

(10) Patent No.: US 6,891,222 B2
(45) Date of Patent: May 10, 2005

(54) NON-VOLATILE MEMORY DEVICES AND METHODS OF FABRICATING THE SAME

(75) Inventors: Dong-Chan Kim, Seoul (KR); Sung-Nam Chang, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/160,875

(22) Filed: May 30, 2002

(65) Prior Publication Data

US 2002/0187609 A1 Dec. 12, 2002

(30) Foreign Application Priority Data

Jun. 7, 2001 (KR) ........................................ 2001-31677

(51) Int. Cl.[7] ............................................ H01L 29/792
(52) U.S. Cl. ........................ 257/324; 438/211; 438/257
(58) Field of Search ................................ 257/314–316, 257/324; 438/211, 257

(56) References Cited

U.S. PATENT DOCUMENTS 6,194,784 B1 * 2/2001 Parat et al. ................. 257/774
6,559,007 B1 * 5/2003 Weimer ...................... 438/257
6,635,530 B2 * 10/2003 Helm et al. ................. 438/257

* cited by examiner

Primary Examiner—Evan Pert
Assistant Examiner—Asok Kumar Sarkar
(74) Attorney, Agent, or Firm—Marger Johnson & McCollom, P.C.

(57) ABSTRACT

Non-volatile memory devices and fabrication methods thereof are provided. The device includes a plurality of isolation layers formed at a semiconductor device, a plurality of stacked gates crossing over an active region between the isolation layers, and an oxidation barrier layer covering the stacked gate. Each of the stacked gates has a control gate electrode crossing over the active region, a floating gate interposed between the control gate electrode and the active region, and an inter-gate dielectric layer interposed between the control gate electrode and the floating gate. Also, the inter-gate dielectric layer has a bottom dielectric layer, an intermediate dielectric layer and a top dielectric layer which are sequentially stacked. The oxidation barrier layer is formed prior to a subsequent thermal oxidation process for curing etch damage that occurs during formation of the stacked gates.

7 Claims, 8 Drawing Sheets

Fig. 8B though the thermal oxidation process is performed.
NON-VOLATILE MEMORY DEVICES AND METHODS OF FABRICATING THE SAME

RELATED APPLICATION

This application relies for priority upon Korean Patent Application No. 2001-31677, filed on Jun. 7, 2001, the contents of which are herein incorporated by this reference in their entirety.

FIELD OF THE INVENTION

The present invention relates to semiconductor memory devices and methods of fabricating the same and, more specifically, to non-volatile memory devices and methods of fabricating the same.

BACKGROUND OF THE INVENTION

Semiconductor memory devices for storing data can typically be categorized as either volatile memory devices or non-volatile memory devices. The volatile memory devices lose their stored data when their power supplies are interrupted, however the non-volatile memory devices retain their stored data even when their power supplies are interrupted. Thus, the non-volatile memory devices are widely used in memory cards, mobile telecommunication systems and the like.

Programming and erasing operations of the non-volatile memory devices can be achieved by the F-N (Fowler-Nordheim) tunneling effect through a tunnel oxide layer interposed between a floating gate and a substrate. The F-N tunneling occurs when an electric field of 6 MV/cm to 8 MV/cm is applied to the tunnel oxide layer. The electric field between the floating gate and the substrate is actually induced by applying a high voltage of 15 volts to 20 volts to a control gate electrode, which is located over the floating gate. Accordingly, it is necessary to increase the so-called coupling ratio of the non-volatile memory cell in order to reduce the programming voltage or the erasing voltage. The coupling ratio (CR) is given by the following equation.

$$CR=C_{ono}/(C_{ono}+C_{tun})$$

wherein, "$C_{ono}$" represents inter-gate dielectric capacitance between the floating gate and the control gate electrode, and "$C_{tun}$" represents tunnel oxide capacitance between the floating gate and the substrate.

As can be seen from the above equation, it is necessary to increase the inter-gate dielectric capacitance $C_{ono}$ and/or to reduce the tunnel oxide capacitance $C_{tun}$ in order to obtain a higher coupling ratio. Accordingly, an oxide-nitride-oxide (ONO) layer is widely used as the inter-gate dielectric layer in order to increase the coupling ratio. However, in the event that the inter-gate dielectric layer is formed of the ONO layer, oxygen atoms can be continuously introduced into the interface between the nitride layer of the ONO layer and a top or a bottom oxide layer of the ONO layer during subsequent processes. Thus, the ONO layer becomes thicker and the coupling ratio is undesirably reduced.

Figure 1:
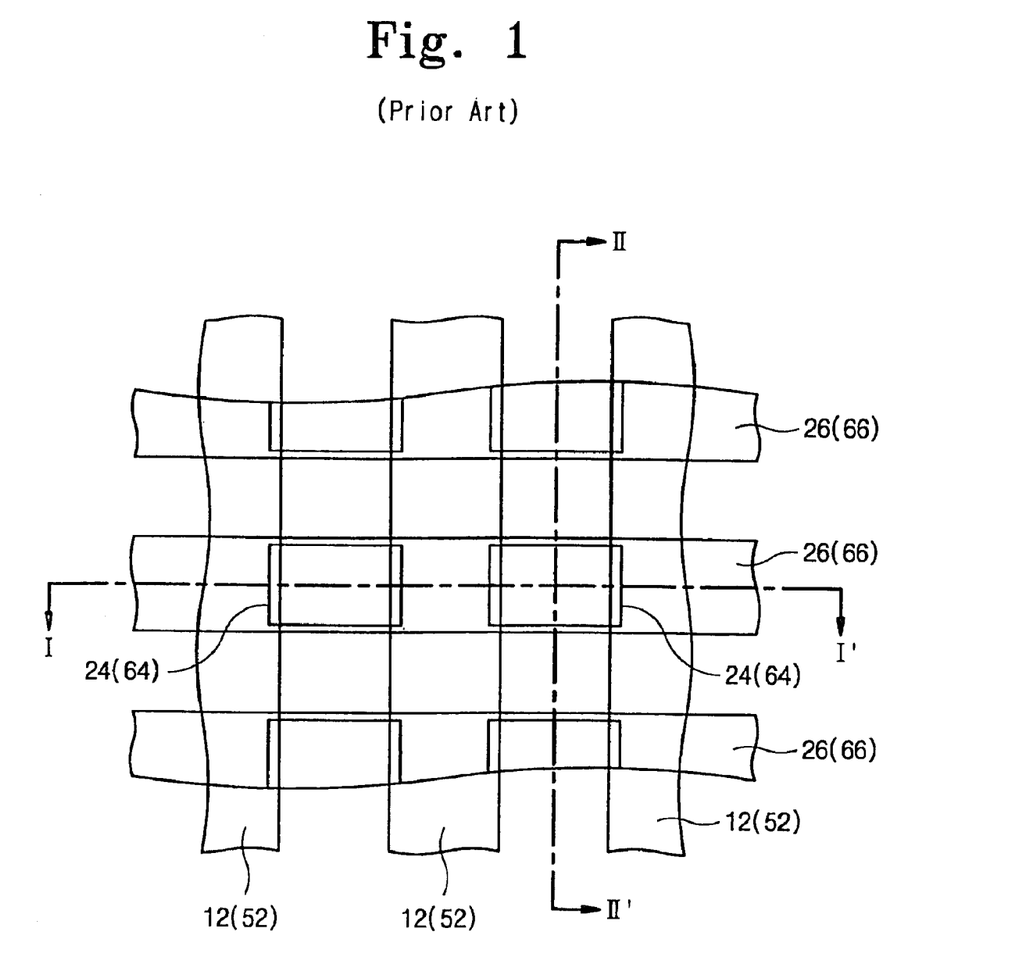
FIG. 1 is a typical top plan view showing a portion of a non-volatile memory device.

FIG. 1 is a typical top plan view showing a portion of a cell array region of the nonvolatile memory device.

Referring to FIG. 1, isolation layers 12 (or 52) are disposed at predetermined regions of a semiconductor substrate to define an active region. At least one control gate electrode 26 (or 66) runs across the isolation layers 12 (or 52) and the active region therebetween. A floating gate 24 (or 64) is interposed between the control gate electrode 26 (or 66) and the active region. The floating gate 24 (or 64) is electrically insulated from the substrate by a tunnel oxide layer (not shown). Also, the floating gate 24 (or 64) is electrically insulated from the control gate electrode 26 (or 66) by an inter-gate dielectric layer (not shown). Accordingly, charges are stored in the floating gate that acts as a storage node.

Figure 2A:
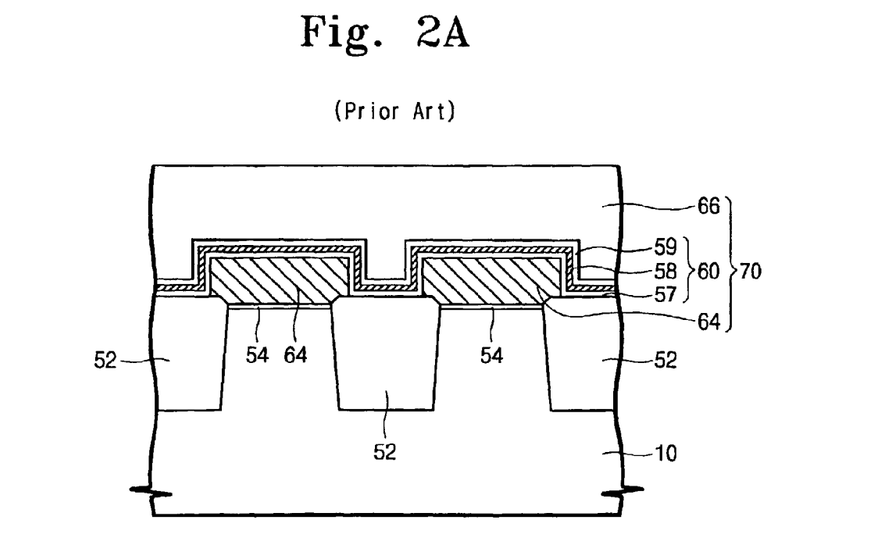
FIGS. 2A and 3A are cross-sectional views illustrating a conventional method of fabricating a non-volatile memory device, taken along the line I–I' of FIG. 1.
Figure 2B:
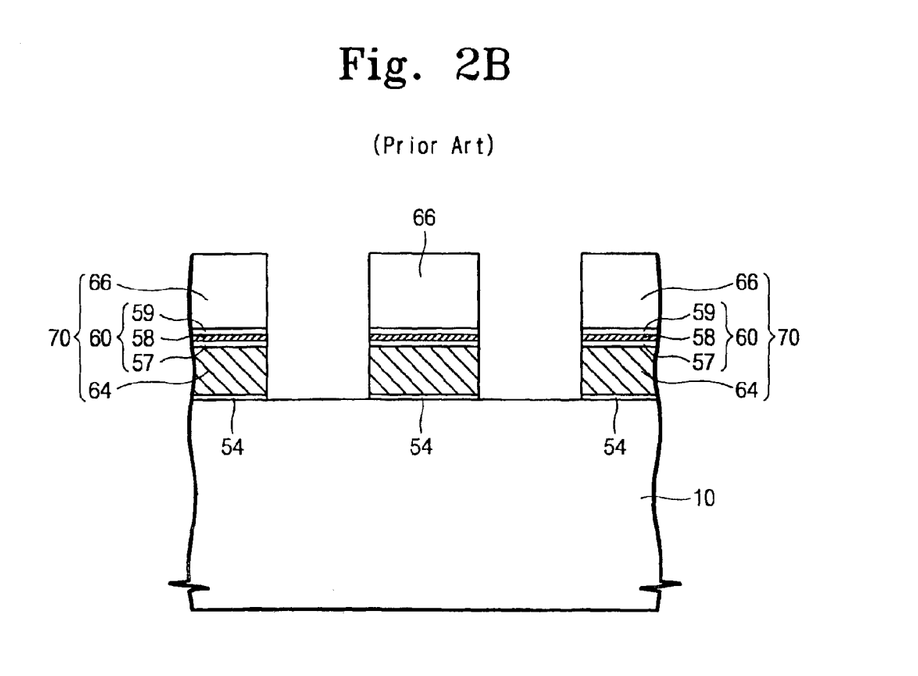
FIGS. 2B and 3B are cross-sectional views illustrating a conventional method of fabricating a non-volatile memory device, taken along the line II–II' of FIG. 1.
Figure 3A:
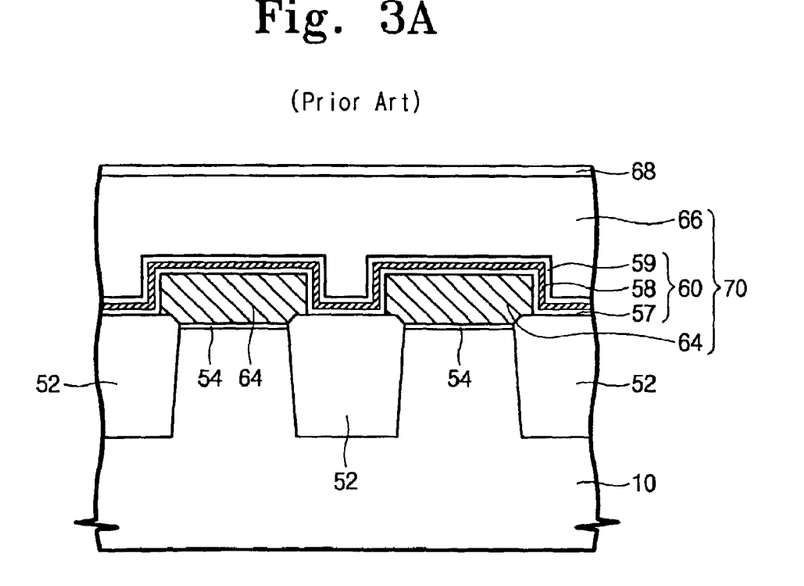
Figure 3B:
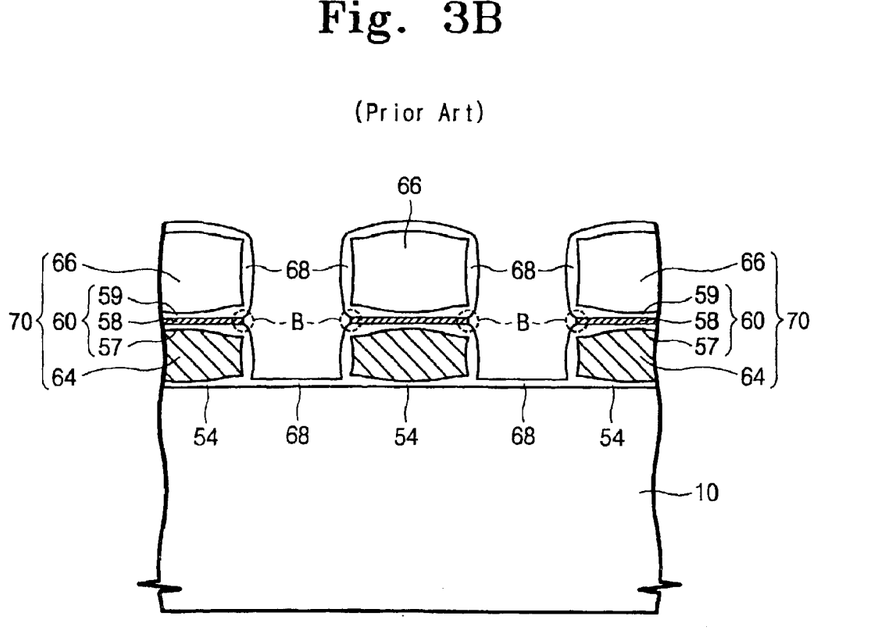

FIGS. 2A and 3A are cross-sectional views for illustrating a conventional method of fabricating a non-volatile memory device, taken along the line I–I' of FIG. 1. FIGS. 2B and 3B are cross-sectional views for illustrating a conventional method of fabricating a non-volatile memory device, taken along the line II–II' of FIG. 1.

Referring to FIGS. 2A and 2B, isolation layers 52 are formed at a semiconductor substrate 10 to define an active region and a stacked gate 70 is formed on the substrate having the isolation layers 52. The stacked gate 70 comprises a floating gate 64, an inter-gate dielectric layer 60 and a control gate electrode 66, which are sequentially stacked. In addition, a tunnel oxide layer 54 is formed between the stacked gate 70 and the active region.

The method of forming the stacked gate 70 includes forming a floating gate pattern that covers the active region. The inter-gate dielectric layer 60 is then formed on the entire surface of the substrate having the floating gate pattern. The inter-gate dielectric layer 60 is formed by sequentially stacking a bottom dielectric layer 57, an intermediate dielectric layer 58 and a top dielectric layer 59. The bottom dielectric layer 57 and the top dielectric layer 59 are formed of a CVD oxide layer, and the intermediate dielectric layer 58 is formed of a silicon nitride layer. A control gate conductive layer is then formed on the inter-gate dielectric layer 60. The control gate conductive layer, the inter-gate dielectric layer 60 and the floating gate pattern are successively etched to form the stacked gate 70. Undesirably, etch damage occurs on the semiconductor substrate 10.

Referring to FIGS. 3A and 3B, a thermal oxidation process is applied to the substrate having the stacked gate 70 in order to cure the etch damage. As a result, the surface of the semiconductor substrate 10 between the adjacent stacked gates 70, and the sidewalls and top surfaces of the stacked gates 70 are oxidized to form a thermal oxide layer 68. At this time, the edges of the inter-gate dielectric layer 60 and the tunnel oxide layer 64 become thicker, as shown in FIG. 3B. In particular, the edges of the inter-gate dielectric layer 60 become thicker as compared to the tunnel oxide layer. This is because the diffusibility of the oxygen atoms into the inter-gate dielectric layer 60 is higher than that into the tunnel oxide layer.

In more detail, the oxygen atoms are diffused along the interfaces among the semiconductor substrate 10, the tunnel oxide layer 54, the floating gate 64, the bottom oxide layer 57, the intermediate nitride layer 58, the top oxide layer 59 and the control gate electrode layer 66 during the thermal oxidation process. Thus, the edges of the floating gate 64 and the control gate electrode 66 are oxidized to form bird's beaks. As a result, the edges of the inter-gate dielectric layer 60 and the tunnel oxide layer 54 become thicker.

In particular, the edge thickness of the inter-gate dielectric layer 60 becomes more increased as compared to that of the tunnel oxide layer 54. This is because the intermediate nitride layer 58 is formed of a silicon nitride layer having an oxidation-resistant characteristic. In other words, the sidewall of the intermediate nitride layer 58 is not oxidized even though the thermal oxidation process is performed. Therefore, the sidewall of the intermediate nitride layer 58 is still exposed, whereas the interface between the tunnel oxide layer 54 and the floating gate 64 is covered with the thermal oxide layer 68. Consequently, the oxygen atoms can be continuously supplied into the edge (B) of the intermediate dielectric layer 58, i.e., the interfaces between the intermediate dielectric layer 58 and the top oxide layer 59 as well as between the intermediate dielectric layer 58 and the bottom oxide layer 57, during the thermal oxidation process. Accordingly, the edge thickness of the inter-gate dielectric layer 60 becomes more increased as compared to that of the tunnel oxide layer 54.

According to the prior art as described above, the thickness of the inter-gate dielectric layer becomes more increased as compared to the tunnel oxide layer. Thus, the coupling ratio of the non-volatile memory cell is reduced. Also, the thickness deviations of the tunnel oxide layer and the inter-gate dielectric layer are increased. This leads to non-uniform characteristics of the memory cells throughout the semiconductor substrate.

SUMMARY OF THE INVENTION

It is therefore a feature of the present invention to provide non-volatile memory devices having an oxidation barrier layer covering the stacked gates.

It is another feature of the present invention to provide a method of fabricating a nonvolatile memory device that is capable of preventing the thickness of the inter-gate dielectric layer and the tunnel oxide layer from being increased during a subsequent thermal process.

One feature of the invention can be obtained in a non-volatile memory device. The non-volatile memory device includes a plurality of isolation layers formed at a semiconductor substrate, at least one stacked gate crossing over an active region between the adjacent isolation layers, and an oxidation barrier layer covering the sidewall and the top surface of the stacked gate.

The stacked gate comprises a control gate electrode crossing over the active region, a floating gate interposed between the control gate electrode and the active region, and an intergate dielectric layer interposed between the floating gate and the control gate electrode. The inter-gate dielectric layer includes a bottom dielectric layer, an intermediate dielectric layer and a top dielectric layer, which are sequentially stacked. In more detail, the bottom dielectric layer and the top dielectric layer are a chemical vapor deposition (CVD) oxide layer, and the intermediate dielectric layer is a silicon nitride layer. Also, it is preferable that the oxidation barrier layer is a CVD oxide layer that does not have adverse influence on the data retention characteristic of the non-volatile memory cell.

Another feature of the invention can also be obtained in a non-volatile memory device. This invented method includes forming an isolation layer to define an active region. A floating gate pattern is formed to cover the active region. An inter-gate dielectric layer and a control gate conductive layer are sequentially formed on the entire surface of the substrate having the floating gate pattern. The control gate conductive layer, the inter-gate dielectric layer and the floating gate pattern are successively patterned to form a plurality of stacked gates crossing over the active region.

A conformal oxidation barrier layer is then formed on the entire surface of the substrate including the plurality of stacked gates. Subsequently, the substrate having the oxidation barrier layer is thermally oxidized in order to cure any etch damage that occurs during the etching process for forming the stacked gates.

Preferably, the oxidation barrier layer is formed of a CVD oxide layer such as a medium temperature oxide (MTO) layer.

BRIEF DESCRIPTION OF THE DRAWINGS

The invention may be understood and its objects will become apparent to those skilled in the art by reference to the accompanying drawings as follows:

FIGS. 4A to 8A are cross-sectional views illustrating a method of fabricating a nonvolatile memory device according to a preferred embodiment of the present invention, taken along the line I–I' of FIG. 1; and FIGS. 4B to 8B are cross-sectional views illustrating a method of fabricating a nonvolatile memory device according to a preferred embodiment of the present invention, taken along the line II–II' of FIG. 1.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

Figure 8A:
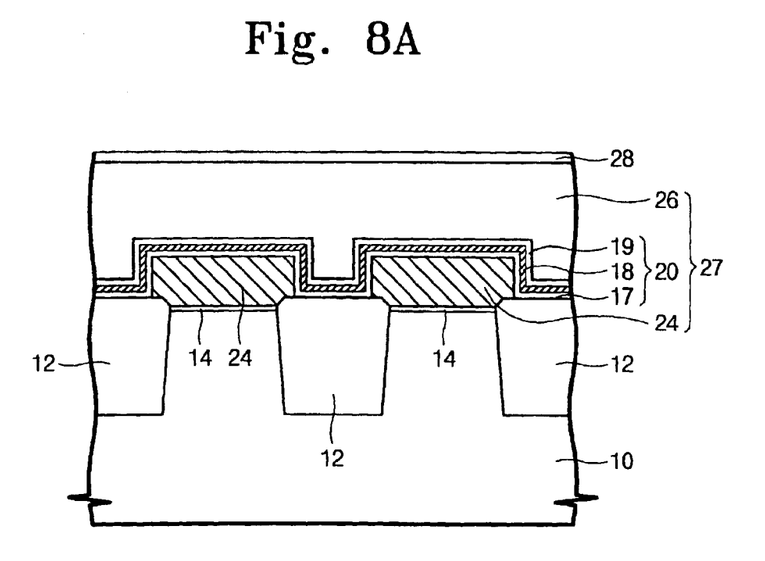

First, non-volatile memory devices according to the present invention are described with reference to FIGS. 8A and 8B. FIG. 8A is a cross-sectional view taken along the line I–I' of FIG. 1, and FIG. 8B is a cross-sectional view taken along the line II–II' of FIG. 1.

Figure 8B:
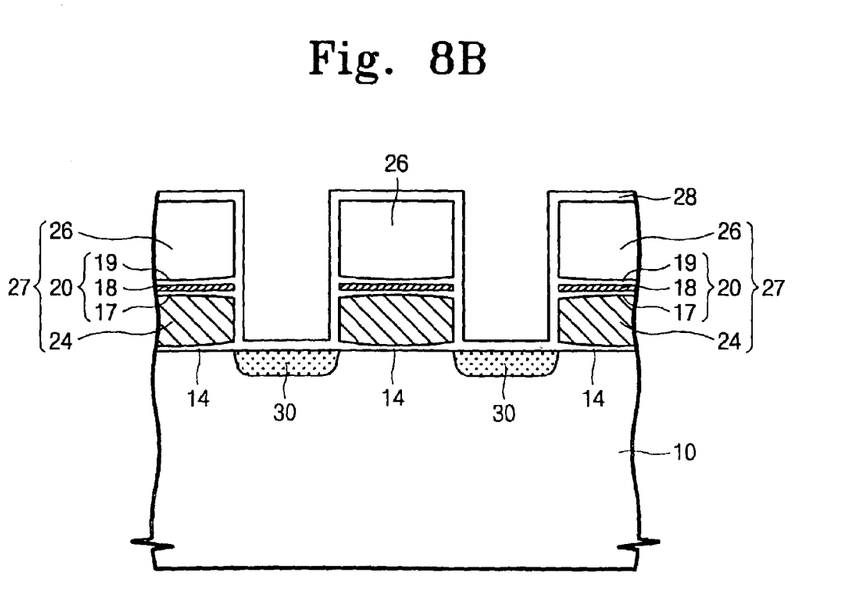

Referring to FIGS. 8A and 8B, isolation layers 12 are disposed at predetermined regions of a semiconductor substrate 10, thereby defining an active region. A plurality of stacked gates 27 are disposed across the active region between the adjacent isolation layers 12. Each of the stacked gates 27 comprises a control gate electrode 26 that crosses over the active region, floating gates 24 interposed between the control gate electrode 26 and the active region, and an inter-gate dielectric layer 20 intervened between the control gate electrode 26 and the floating gates 24.

A tunnel oxide layer 14 is interposed between the respective floating gates 24 and the active region. Both edges of the respective floating gates 24 are overlapped with the edges of the isolation layers 12. The inter-gate dielectric layer 20 comprises a bottom dielectric layer 17, an intermediate dielectric layer 18 and a top dielectric layer 19, which are sequentially stacked. The bottom dielectric layer 17 and the top dielectric layer 19 are composed of a CVD oxide layer, and the intermediate dielectric layer 18 is composed of a silicon nitride layer.

Also, the top surfaces and the sidewalls of the respective stacked gates 27 are covered with an oxidation barrier layer 28. The oxidation barrier layer 28 acts as an oxygen blocking layer that prevents oxygen atoms from being diffused into the interfaces among the top dielectric layer 19, the intermediate dielectric layer 18 and the bottom dielectric layer 17. Thus, the thickness of the inter-gate dielectric layer 20 is thinner than that of the conventional art, even though an oxidation process is performed after formation of the oxidation barrier layer 28. As a result, the non-volatile memory device according to the present invention exhibits higher coupling ratio than the conventional art.

It is preferable that the tunnel oxide layer 14 has a thickness of 50 angstroms to 100 angstroms. The floating gate 24 is preferably composed of a conductive layer such as a doped polysilicon layer. Also, the control gate electrode 26 is preferably composed of a polycide layer or a doped polysilicon layer. In addition, it is preferable that the oxidation barrier layer 28 is a CVD oxide layer or a silicon oxynitride layer that does not adversely influence the data retention characteristic of the non-volatile memory cell.

Furthermore, source/drain regions 30 are formed at the active region between the stacked gates 27 (see FIG. 8B). Also, though not shown in the figure, the oxidation barrier layer 28 on the sidewalls of the stacked gates 27 may be covered with a spacer which is formed of a silicon nitride layer or a silicon oxide layer.

Next, methods of fabricating the non-volatile memory device according to the present invention are described with reference to FIGS. 4A to 8A and FIGS. 4B to 8B. FIGS. 4A to 8A are cross-sectional views taken along the line I–I' of FIG. 1, and FIGS. 4B to 8B are cross-sectional views taken along the line II–II' of FIG. 1.

Figure 4A:
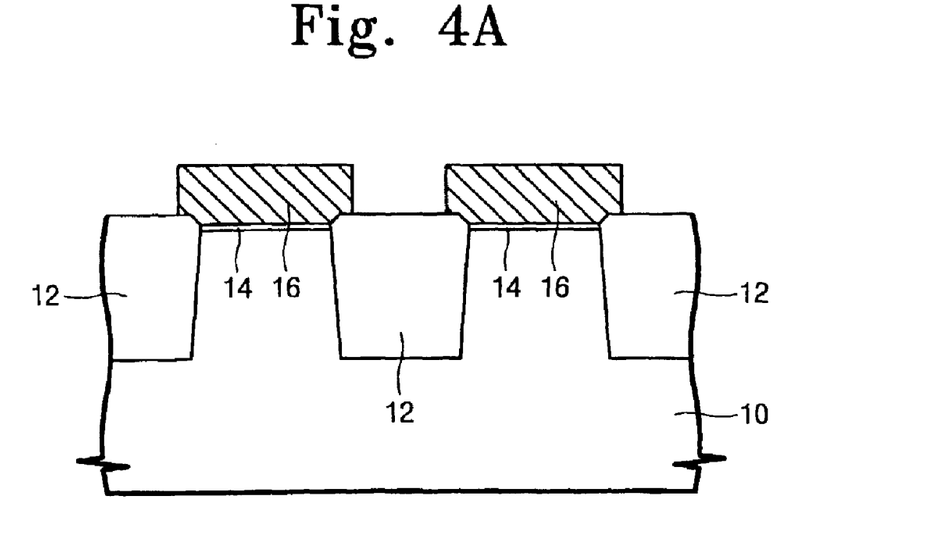
Figure 4B:
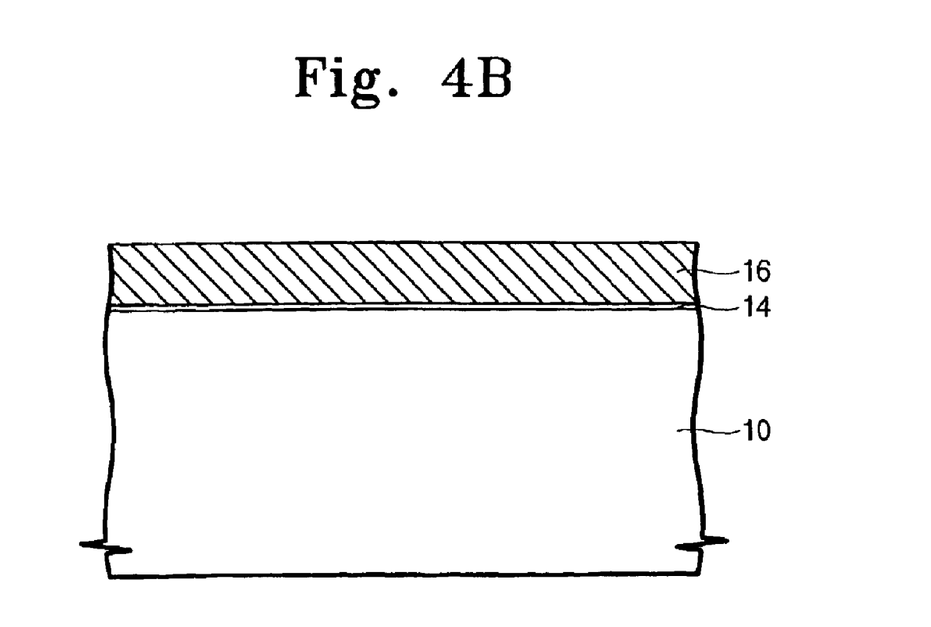

Referring to FIGS. 4A and 4B, isolation layers 12 are formed at predetermined regions of a semiconductor substrate 10, thereby defining an active region. In this embodiment, the isolation layers 12 are formed using a conventional trench isolation technology. An ion implantation process for forming a well can be performed prior to formation of the isolation layers 12. A tunnel oxide layer 14 is formed on the active region. The tunnel oxide layer 14 is preferably formed to a thickness of 50 angstroms to 100 angstroms. However, the thickness of the tunnel oxide layer 14 may be thinner than 50 angstroms in order to optimize the characteristic of the non-volatile memory device. A first conductive layer is then formed on the entire surface of the substrate including the tunnel oxide layer 14. The first conductive layer is preferably formed of a doped polysilicon layer. The first conductive layer is patterned to form a floating gate pattern 16 covering the tunnel oxide layer 14. The edge of the floating gate pattern 16 may be seen to overlap the edges of the isolation layers 12 as shown in FIG. 4A, a long one of two orthogonal axes of each stacked gate.

Figure 5A:
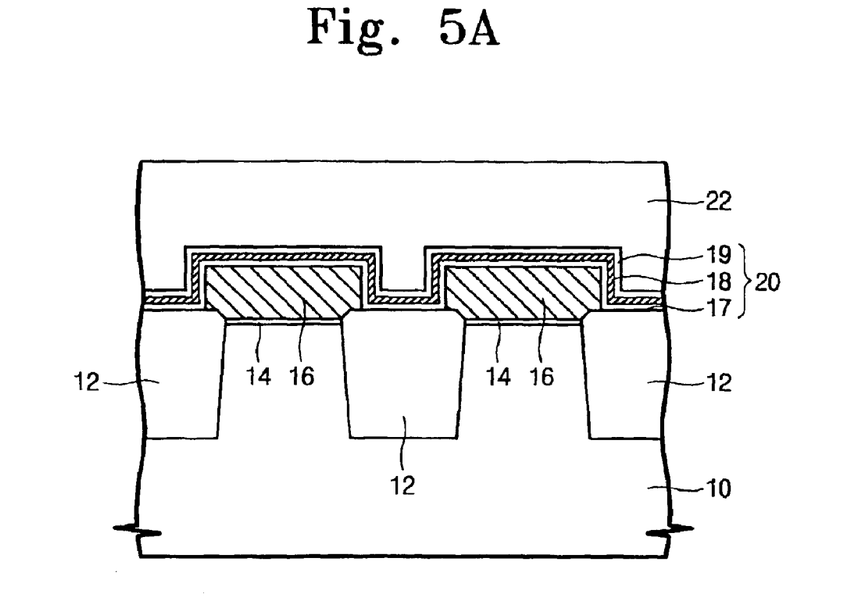
Figure 5B:
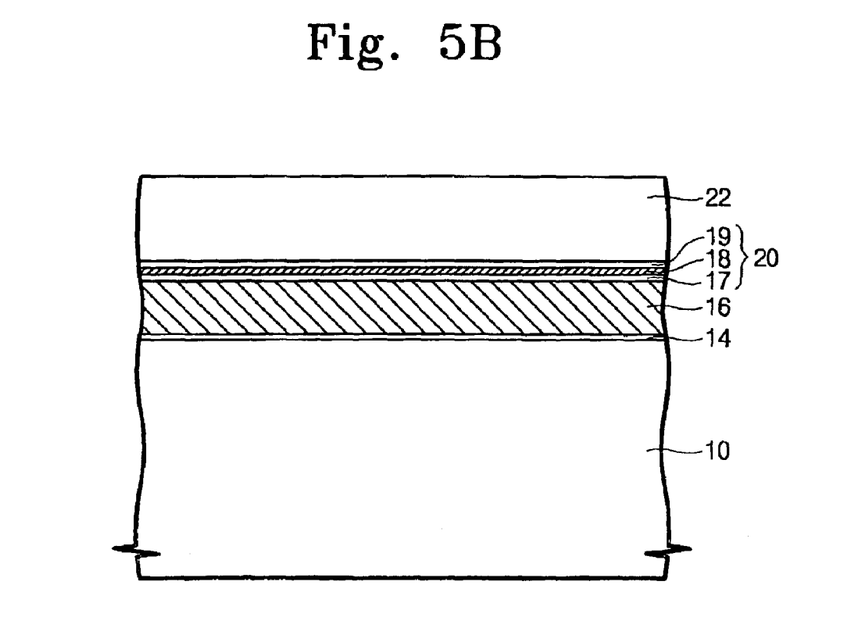

Referring to FIGS. 5A and 5B, a conformal inter-gate dielectric layer 20 and a second conductive layer 22 are sequentially formed on the entire surface of the resultant structure where the floating gate pattern 16 is formed. The inter-gate dielectric layer 20 is formed by sequentially stacking a bottom dielectric layer 17, an intermediate dielectric layer 18 and a top dielectric layer 19. The bottom dielectric layer 17 and the top dielectric layer 19 are formed of a CVD oxide layer, and the intermediate dielectric layer 18 is formed of a silicon nitride layer. The second conductive layer 22 is preferably formed of a doped polysilicon layer or a metal polycide layer. The metal polycide layer can be formed by sequentially stacking a doped polysilicon layer and a metal silicide layer.

Figure 6A:
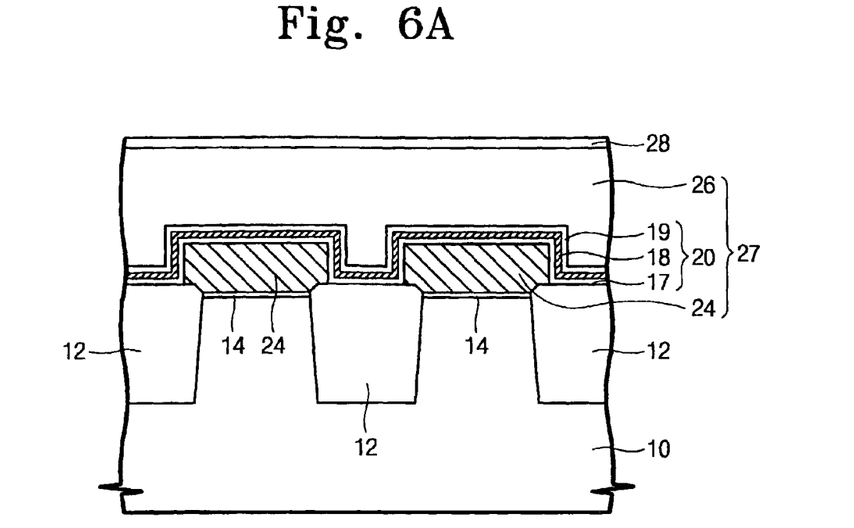
Figure 6B:
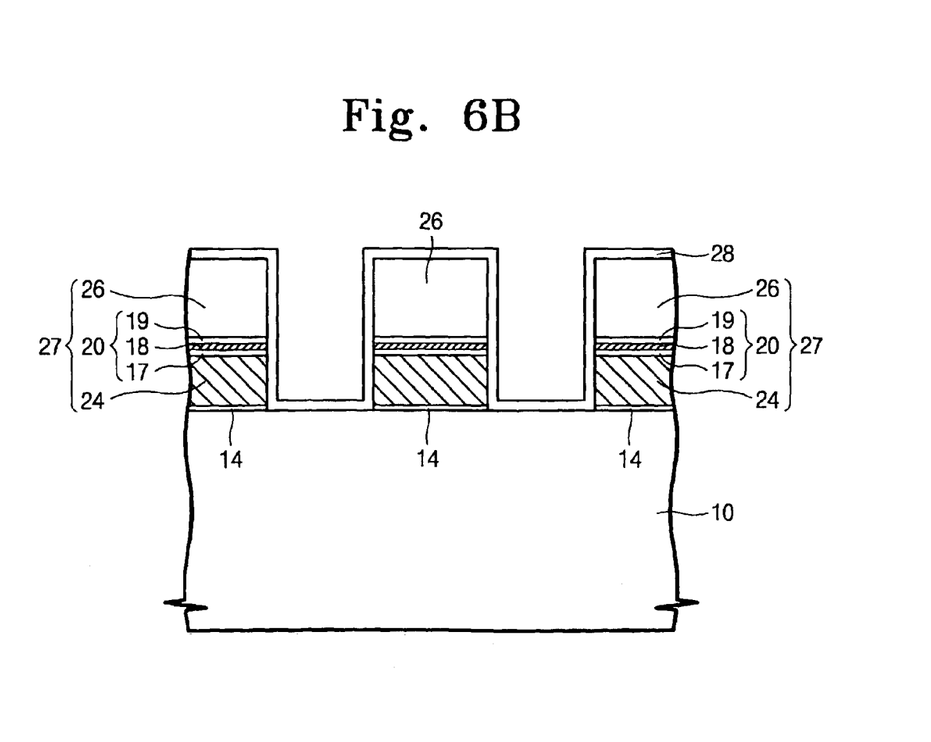

Referring to FIGS. 6A and 6B, the second conductive layer (22 of FIG. 5), the intergate dielectric layer 20 and the floating gate pattern 16 are sequentially patterned to form a plurality of stacked gates 27 crossing over the isolation layers 12 and the active region between the adjacent isolation layers 12. Each of the stacked gates 27 comprises a control gate electrode 26 crossing over the active region between the isolation layers 12 and a plurality of floating gates 24 intervening between the control gate electrode 26 and the active region. The inter-gate dielectric layer 20 is interposed between the control gate electrode 26 and the floating gates 24, and the tunnel oxide layer 14 is interposed between the floating gates 24 and the active region.

The semiconductor substrate 10 between the stacked gates 27 can be exposed while the floating gate pattern 24 is etched to form the stacked gates 27. As a result, etch damage is applied to the surface of the exposed substrate. In other words, crystalline defects may be generated at the surface of the exposed semiconductor substrate. The crystalline defects lead to junction leakage current as well as non-uniform diffusion of ion impurities, which are implanted in a subsequent process. Thus, the crystalline defects should be removed using a thermal oxidation process or the like. According to the conventional technology, the thermal oxidation process for curing the etch damage is performed after the patterning process for forming the stacked gates 27 as described in FIG. 3B. Therefore, the sidewalls of the stacked gates 27 are exposed at an initial step of the thermal oxidation process. Accordingly, it is difficult to avoid the excessive increase of the thickness of the inter-gate dielectric layer.

However, the present invention employs forming a conformal oxidation barrier layer 28 on the entire surface of the resultant structure having the stacked gates 27 prior to the thermal oxidation process. The oxidation barrier layer 28 is preferably formed of a material layer that is deposited at a low temperature such that the floating gates 24, the control gate electrodes 26 and the semiconductor substrate 10 are not oxidized. Also, the oxidation barrier layer 28 is preferably formed of a material layer that does not adversely influence the data retention characteristic of the non-volatile memory cell. For example, it is preferable that the oxidation barrier layer 28 is formed of a CVD oxide layer or a silicon oxynitride layer. The CVD oxide layer is preferably formed of a medium temperature oxide (MTO) layer.

Figure 7A:
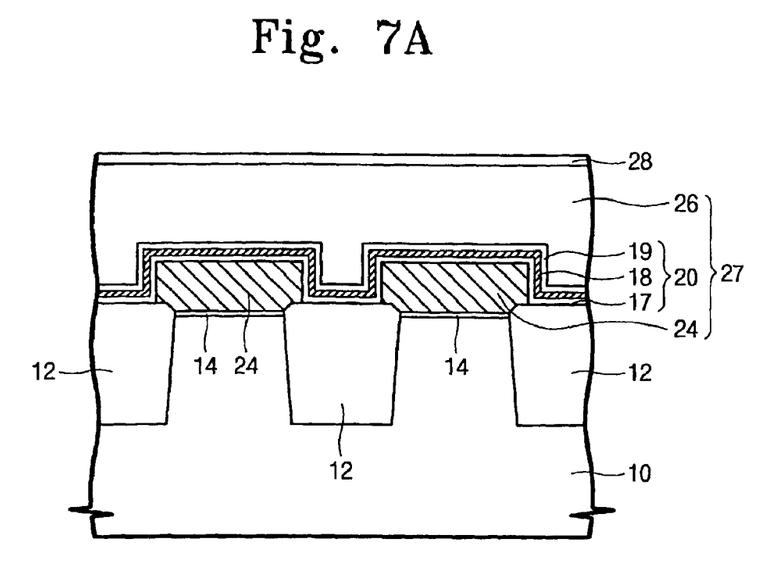
Figure 7B:
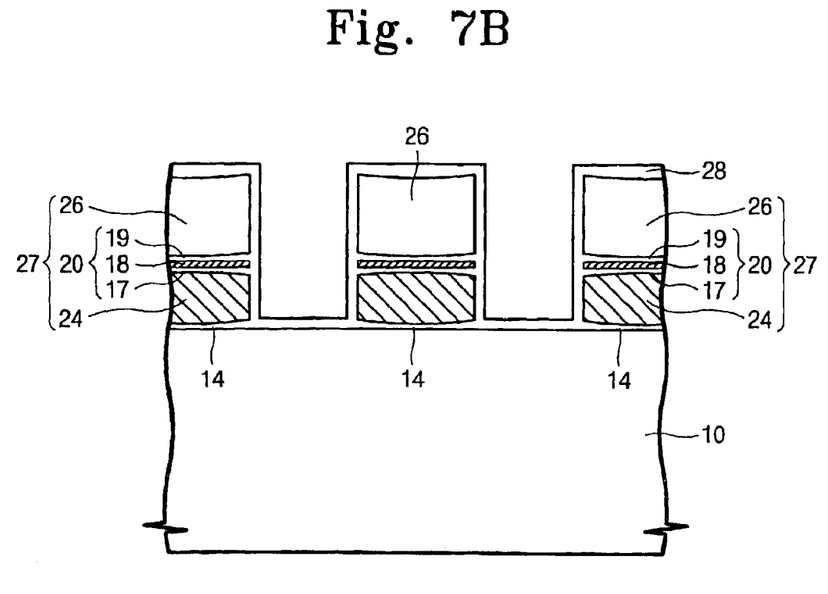

Referring to FIGS. 7A and 7B, the substrate having the oxidation barrier layer 28 is thermally oxidized to cure any etch damage. The sidewalls of the stacked gates 27 are covered with the oxidation barrier layer 28 during the thermal oxidation process. Thus, the number of oxygen atoms that are diffused into the inter-gate dielectric layer 20 during the thermal oxidation process is remarkably reduced due to the presence of the oxidation barrier layer 28 as compared to the conventional art. As a result, it can prevent the coupling ratio of the memory cell from being reduced.

Referring to FIGS. 8A and 8B, ion impurities are implanted into the active region using the stacked gates 27 and the isolation layers 12 as ion implantation masks, thereby forming source/drain regions 30 between the stacked gates 27.

Thereafter, though not shown in the figure, an inter-layer insulating layer and interconnections are formed using a conventional manner on the substrate having the source/drain regions 30.

From the foregoing it can readily be seen that, in accordance with the present invention, the oxidation barrier layer is formed on the sidewalls and the top surfaces of the stacked gates prior to the thermal oxidation process for curing the etch damage. Thus, edges of the interfaces between the layers that constitute the stacked gate are covered with the oxidation barrier layer. As a result, it can suppress the thickness of the inter-gate dielectric layer as well as the tunnel oxide layer from being increased during the subsequent thermal oxidation process. In other words, it can prevent the coupling ratio of the cell from being reduced. Therefore, it is possible to realize a reliable and high performance non-volatile memory device.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A non-volatile memory device comprising:
   a plurality of isolation layers formed at a semiconductor substrate, the isolation layers defining an active region;
   a stacked gate crossing over the active region and the isolation layers, the stacked gate having a top surface and a sidewall, the stacked gate including a control gate electrode crossing over the active region, a floating gate interposed between the control gale electrode and the active region, and an inter-gate dielectric layer interposed between the floating gate and the control gate electrode; and
   a silicon oxynitride oxidation barrier layer extending over the top surface and directly contacting the sidewall of the stacked gate.

2. The non-volatile memory device of claim 1, wherein the control gate electrode comprises a polysilicon layer and a metal suicide layer that are sequentially stacked.

3. The non-volatile memory device of claim 1, wherein both edges of the floating gate are overlapped with the isolation layer along one of two orthogonal axes of the stacked gate.

4. The non-volatile memory device of claim 1, wherein the inter-gate dielectric layer comprises a bottom dielectric layer, an intermediate dielectric layer and a top dielectric layer which are sequentially stacked.

5. The non-volatile memory device of claim 4, wherein the top dielectric layer and the bottom dielectric layer are a CVD oxide layer.

6. The non-volatile memory device of claim 4, wherein the intermediate dielectric layer is a silicon nitride layer.

7. The non-volatile memory device of claim 1, wherein the oxidation barrier layer has a thickness of approximately 50 angstroms to 100 angstroms.

* * * * *

UNITED STATES PATENT AND TRADEMARK OFFICE
CERTIFICATE OF CORRECTION

PATENT NO. : 6,891,222 B2
APPLICATION NO. : 10/160875
DATED : May 10, 2005
INVENTOR(S) : Kim et al.

Page 1 of 1

It is certified that error appears in the above-identified patent and that said Letters Patent is hereby corrected as shown below:

At column 7, line 29, please replace "control gale electrode" with --control gate electrode--

At column 8, line 9, please replace "metal suicide" with --metal silicide--

Signed and Sealed this

Twenty-first Day of November, 2006

JON W. DUDAS
*Director of the United States Patent and Trademark Office*